United States Patent
McMahon et al.

(10) Patent No.: US 6,208,527 B1
(45) Date of Patent: Mar. 27, 2001

(54) RETENTION MECHANISM ASSEMBLY FOR PROCESSOR CARTRIDGES WITH CAPTURED SCREW FASTENERS

(75) Inventors: John F. McMahon, Phoenix; Michael R. Stark, Tempe, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/098,086

(22) Filed: Jun. 16, 1998

(51) Int. Cl.[7] .................................................. H05K 7/14
(52) U.S. Cl. .................... 361/801; 361/740; 361/752; 361/759; 439/377
(58) Field of Search ................................. 361/728, 730, 361/732, 752, 753, 759, 796, 801, 802, 740; 439/62, 64, 377; 211/41.17

(56) References Cited

U.S. PATENT DOCUMENTS

| | | | |
|---|---|---|---|
| 3,662,224 | * 5/1972 | Rauch | ................................... 361/801 |
| 5,650,917 | * 7/1997 | Hsu | ...................................... 361/759 |
| 5,822,197 | * 10/1998 | Thuault | ................................ 361/803 |
| 5,829,601 | * 11/1998 | Yurchenco et al. | ............. 361/740 X |
| 5,889,656 | * 3/1999 | Yin | ...................................... 361/740 |

* cited by examiner

Primary Examiner—Jayprakash N. Gandhi
(74) Attorney, Agent, or Firm—Blakely, Sokoloff, Taylor & Zafman LLP

(57) ABSTRACT

An electronic cartridge which has a fastener that can attach the cartridge to a motherboard. The fastener is captured by a cover that also captures a substrate. The substrate may be coupled to a connector that is mounted to the motherboard. The fastener may be attached to a retention mechanism that is also mounted to the motherboard. The fastener may have a threaded portion that is screwed into a corresponding threaded aperture of the retention mechanism. The fastener and retention mechanism provide a rugged attachment of the cartridge to the motherboard. The cover and retention mechanism may be constructed from an electrically conductive material which provides a shield to electro-magnetic interference (EMI).

23 Claims, 3 Drawing Sheets

RETENTION MECHANISM ASSEMBLY FOR PROCESSOR CARTRIDGES WITH CAPTURED SCREW FASTENERS

BACKGROUND OF THE INVENTION

1. Field of the Invention

The present invention relates to a retention mechanism for an electronic assembly.

2. Background Information

Integrated circuits are typically assembled into packages that are mounted to a printed circuit board. The printed circuit board may have a plurality of contact pads which plug into a mating connector. The mating connector may be mounted to a motherboard of a computer system. The contact pads must be aligned with corresponding contacts of the connector to properly connect the printed circuit board with the motherboard. Plugging the circuit board into the motherboard connector is typically a manual process which requires a certain level of skill to align the pads and contacts of the connector.

Some computer systems contain mechanical guide rails which receive the edges of the printed circuit board and align the pads with the contacts when the board is being plugged into the connector. The circuit board must be plugged into the connector in the correct orientation to properly operate within a computer system. It is therefore desirable to provide a keying feature which will insure that the circuit board is always plugged into the motherboard connector in the proper orientation.

Computer systems are sometimes exposed to shock and vibration loads. The shock and vibration loads create stresses in the printed circuit board and the motherboard connector. The guide rails are typically mounted to a metal frame of a computer which provides structural support for the circuit board and the connector. Some computer systems incorporate mechanical latches to secure the printed circuit board to the motherboard. The latches typically cooperate with the guide rail or other feature of the computer chassis.

The dimensional tolerances of the assembly must be kept within certain limits to insure that the latches are properly aligned and operable. Restrictive tolerances can increase the cost of producing the assembly. Additionally, the latches may increase the overall height of the assembly. It would be desirable to provide a retention mechanism which can secure a printed circuit board assembly to a motherboard while minimizing the height of the assembly and not requiring undesirable tolerances for the assembly components.

The integrated circuit within the package may be a microprocessor which contains millions of transistors that switch states at a very high frequency. The high speed processors may emit electro-magnetic interference (EMI) which may produce electrical noise within the computer system. It would be desirable to provide an electrical assembly that reduces the amount of EMI that is transmitted from an integrated circuit.

SUMMARY OF THE INVENTION

One embodiment of the present invention is an electronic cartridge which may have an integrated circuit package mounted to a substrate. The substrate is captured by a cover. The cover also captures a fastener.

DETAILED DESCRIPTION OF THE INVENTION

One embodiment of the present invention is an electronic cartridge which has a fastener that can attach the cartridge to a motherboard. The fastener is captured by a cover that also captures a substrate. The substrate may be coupled to a connector that is mounted to the motherboard. The fastener may be attached to a retention mechanism that is also mounted to the motherboard. The fastener may have a threaded portion that is screwed into a corresponding threaded aperture of the retention mechanism. The fastener and retention mechanism provide a rugged attachment of the cartridge to the motherboard. The cover and retention mechanism may be constructed from an electrically conductive material which provides a shield to electro-magnetic interference (EMI).

Figure 1:
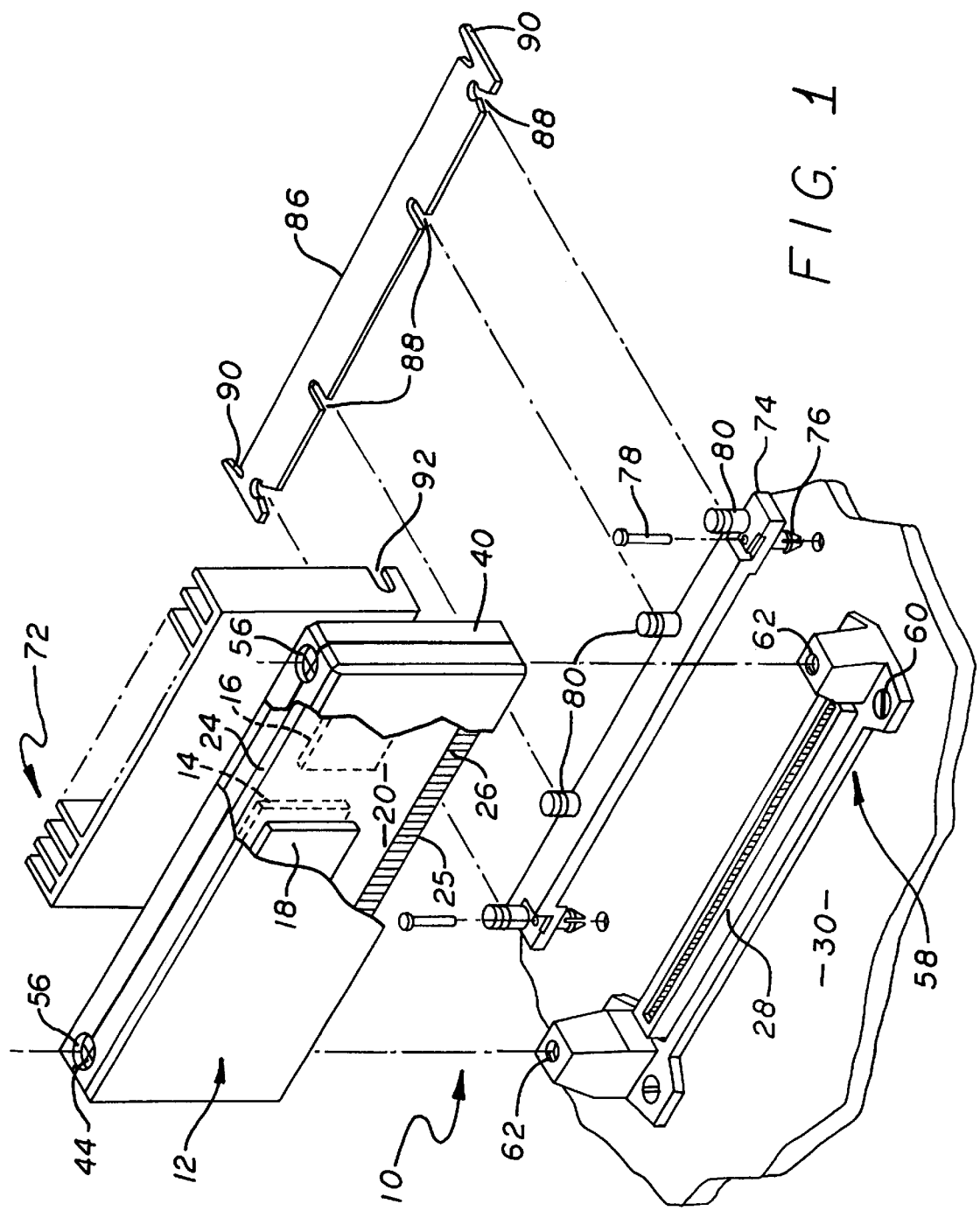
FIG. 1 is a perspective view of an embodiment of an electronic cartridge of the present invention.

Referring to the drawings more particularly by reference numbers, FIG. 1 shows an embodiment of an electronic assembly 10 of the present invention. The assembly 10 may include an electronic cartridge 12. The cartridge 12 may have a plurality of integrated circuit packages 14, 16 and 18 that are mounted to a substrate 20.

Figure 2A:
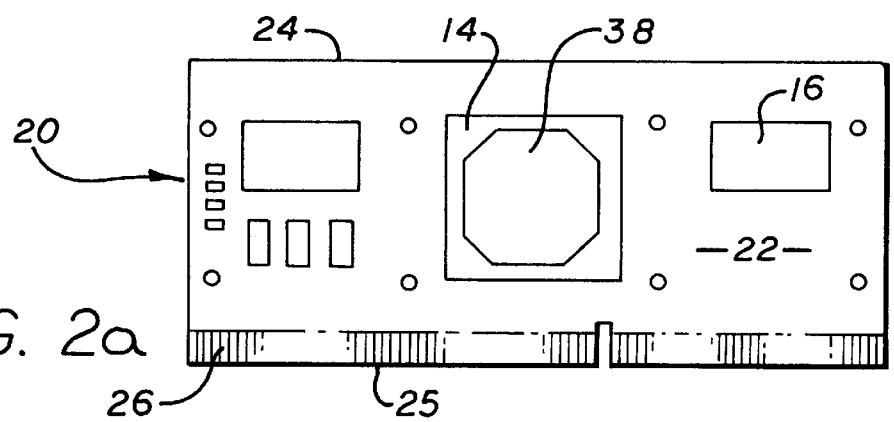
FIG. 2a is a front view of a printed circuit board assembly of the cartridge.
Figure 2B:
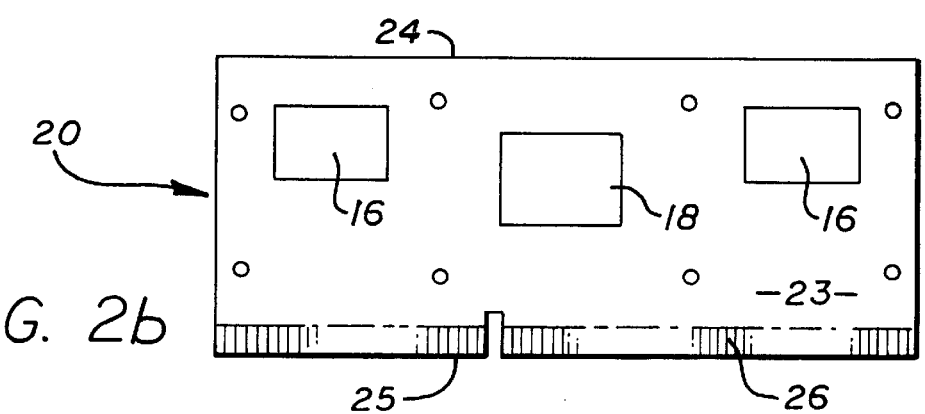
FIG. 2b is a rear view of the printed circuit board assembly.

FIGS. 2a and 2b show the integrated circuit packages 14, 16 and 18 mounted to a first side 22 and a second side 23 of the substrate 20. The substrate 20 may be a printed circuit board which has surface pads, routing traces, power/ground planes, vias, etc. The substrate 20 may also have a first edge 24 and a second opposite edge 25. The second edge 25 of the substrate 20 may have a plurality of contact pads 26.

Referring to FIG. 1, the contact pads 26 may be inserted into an electrical connector 28. The electrical connector 28 may be mounted to a motherboard 30. The motherboard 30 may be a printed circuit board that is coupled to other electronic devices. By way of example, the motherboard 30 may support and be connected to memory devices (not shown). Although a card edge connector 28 is shown and described, it is to be understood that the assembly may employ other types of connectors such as a pin connector.

Figure 3:
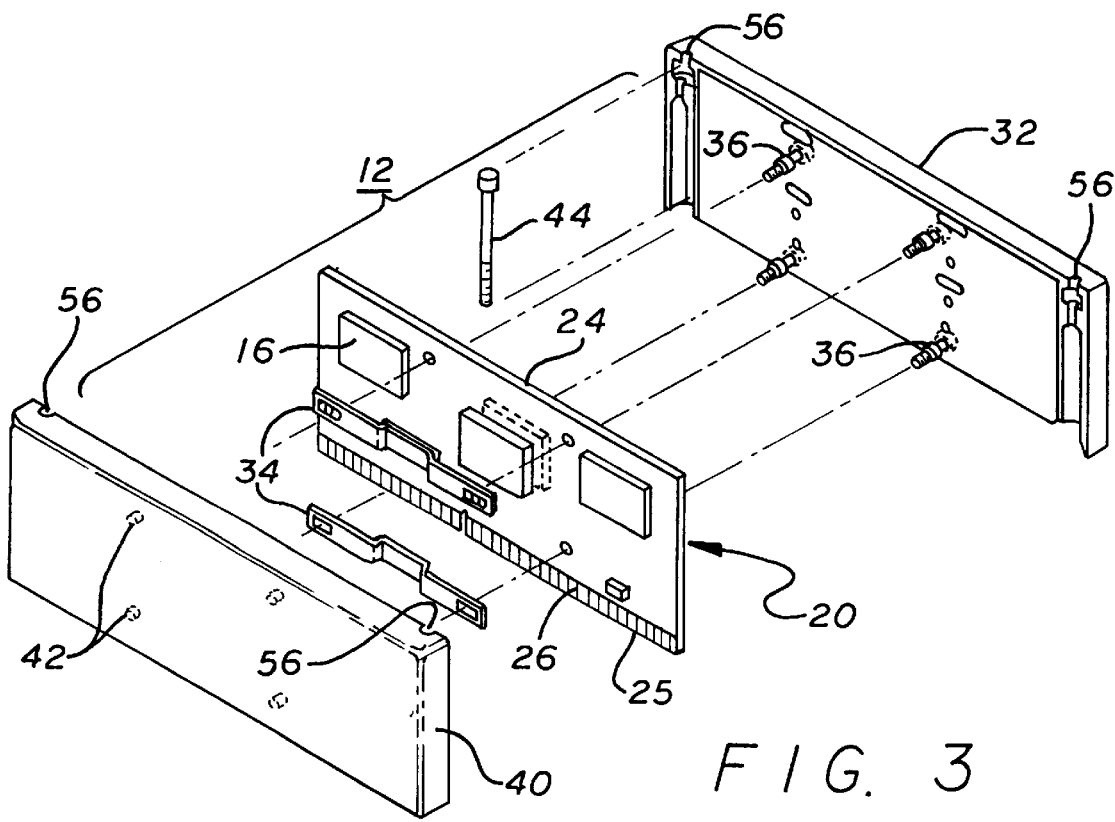
FIG. 3 is an exploded view of the electronic cartridge.

As shown in FIG. 3, the cartridge 12 may have a first cover plate 32 that is attached to the substrate 20 by spring clips 34 and screw 36. The clips 34 may snap onto shoulder portions of the screws 36. The cover plate 32 can be thermally coupled directly to a metal slug 38 (see FIG. 2a) of the integrated circuit package 14. The first cover plate 32 may also be attached to a second cover plate 40 by the screws 36 which are screwed into corresponding threaded apertures 42 of the second plate 40. The cover plates 32 and 40 may form a cover that essentially encloses the integrated circuit packages 14, 16 and 18.

Figure 4:
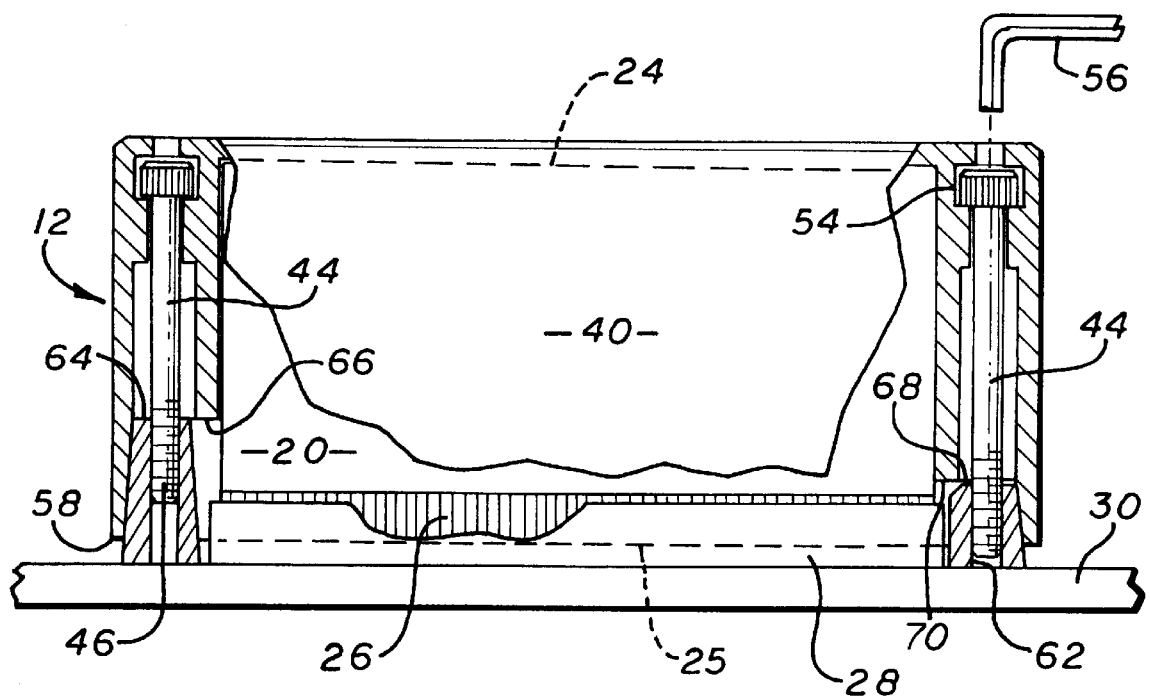
FIG. 4 is a front sectional view showing an electronic cartridge of the assembly.

As shown in FIG. 4, the cartridge 12 may have a pair of fasteners 44 that are captured by the cover plates 32 and 40. Each fastener 44 may have a threaded portion 46 which extends from a collar 48 and head portion 50. The cover 40 may be constructed from two separate parts that are assembled to capture the fastener 44. The captured fastener 44 can be rotated but not removed from the cartridge 12. The cover 40 may have a pair of openings 56 which allow an operator to insert a tool such as an Allen wrench into the head portion 50 and rotate the fastener 44. Each head 50 may have slots (not shown) that can receive a tool such as a screwdriver.

As shown in FIG. 1, the assembly 10 may further include a retention mechanism 58 which is mounted to the motherboard 30 by a number of fasteners 60. The retention mechanism 58 is located adjacent to the connector 28. The mechanism 58 may have a pair of threaded apertures 62 that can receive the threaded portions 46 of the fasteners 44. The fasteners 44 can be screwed into the retention mechanism 58 to secure the cartridge 12 to the motherboard 30 and the connector 28.

The retention mechanism 58 may have a first key surface 64 that mates with a corresponding first key surface 66 of the cover 40, and a second key surface 68 which mates with a corresponding second key surface 70 of the cover 40. When the substrate 20 is plugged into the connector 28, the first key surfaces 64 and 66 are located a distance from the motherboard 30 that is different than the distance which separates the motherboard 30 from the second key surfaces 68 and 70. The different distances insure that the substrate 20 is plugged into the connector 28 in a proper orientation.

The cover plates 32 and 40 and retention mechanism 58 may be constructed from a thermally and electrically conductive material such as aluminum or copper. The pins 36 and 42 may also be constructed from an electrically conductive material such as aluminum or steel. The integrated circuits within the packages 14, 16 and 18 may generate EMI. The EMI may be absorbed by the electrically conductive material of the cover 40 and the thermal plate 32. The cover 40 and retention mechanism 58 may provide an electrical path to the motherboard 30. The motherboard 30 may have conductive surface pads (not shown) that are contiguous with the retention mechanism 58 and connected to a ground bus. The cover 40 and retention mechanism 58 can thus provide an EMI shield for the cartridge 12.

Figure 5:
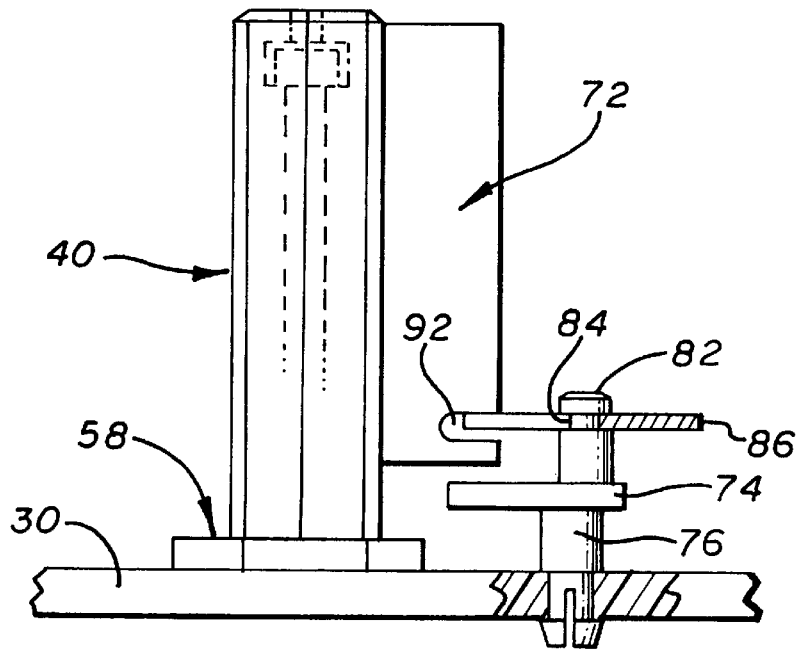
FIG. 5 is a side view of the electronic cartridge.

Referring to FIGS. 1 and 5, a heat sink 72 can be attached to the first cover plate 32 to more efficiently remove heat generated by the integrated circuits within the packages 14, 16 and 18. The assembly 10 may include a base plate 74 that is mounted to the motherboard 30. The base plate 74 may have a pair of inserts 76 that are pressed into the motherboard 30 and a pair of pins 78 that are pressed into the inserts 76.

Extending from the base plate 74 are a plurality of posts 80. Each post 80 may have a head portion 82 that is located adjacent to a neck portion 84. The posts 80, base plate 74 and inserts 76 may be molded as an integral plastic part.

The assembly 10 may further include a tie bar 86 that is coupled to the heat sink 72 and the post 80. The tie bar 86 may have a plurality of slots 88 that are inserted onto the neck portions 84 of the posts 80. The ends of the tie bar 86 may have levers 90 which can be pushed inward to enlarge the outer slots 88 and allow an operator to pull the tie bar 86 away from the post 80. The tie bar 86 may be inserted into a corresponding groove 92 of the heat sink 72. The tie bar 86 and base plate 74 may support the heat sink 72.

The cartridge 12 can be assembled to the motherboard 30 by first inserting the contact pads 26 into the connector 28. The fasteners 44 can then be screwed into the retention mechanism 58. The tie bar 86 is pressed onto the post 80 and inserted into the groove 92 of the heat sink 72 to complete the assembly.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic cartridge, comprising:

a substrate;

an integrated circuit package mounted to said substrate;

a cover that captures said substrate and defines a first key surface at a first plane and a second key surface at a second plane, the first plane being different than the second plane, to mate with a retention mechanism having a first key surface uniquely matched to the first key surface of the cover and a second key surface uniquely matched to the second key surface of the cover; and, a fastener that is captured by said cover.

2. The cartridge as recited in claim 1, wherein said substrate includes a plurality of contact pads.

3. The cartridge as recited in claim 1, wherein said cover includes a first cover plate that is coupled to said substrate.

4. The cartridge as recited in claim 1, wherein said cover is constructed from an electrically conductive material.

5. The cartridge as recited in claim 1, wherein said fastener includes a threaded portion.

6. The electronic assembly as recited in claim 1, wherein the first and second key surfaces are cavities at different planes.

7. The electronic assembly as recited in claim 6, wherein neither the first nor second cavity extends the height of the cover.

8. The electronic assembly as recited in claim 1, wherein the first and second key surfaces are posts at different planes.

9. The electronic assembly as recited in claim 1, wherein the first key surface is a cavity and said second key surface is a post.

10. The electronic assembly as recited in claim 1, wherein the first and second key surfaces comprise horizontal surfaces.

11. The electronic assembly as recited in claim 1, wherein the first and second key surfaces comprise both vertical and horizontal surfaces.

12. An electronic assembly, comprising:

a motherboard;

a connector mounted to said motherboard;

a retention mechanism mounted to said motherboard;

a substrate which is coupled to said connector;

an integrated circuit package mounted to said substrate;

a cover that captures said substrate and defines a first and a second key surfaces at different distances from the motherboard to mate with a retention mechanism having a first key surface uniquely matched to the first key surface of the cover and a second key surface uniquely matched to the second key surface of the cover; and, a fastener that is captured by said cover and attached to said retention mechanism.

13. The assembly as recited in claim 12, wherein said substrate includes a plurality of contact pads.

14. The assembly as recited in claim 12, wherein said cover includes a first cover plate that is coupled to said substrate.

15. The assembly as recited in claim 12, wherein said cover and said retention mechanism are constructed from an electrically conductive material.

16. The assembly as recited in claim 12, wherein said fastener includes a threaded portion.

17. The assembly as recited in claim 12, wherein said retention mechanism has a first key surface located a first distance from said motherboard and a second key surface located a second distance from said motherboard.

18. The electronic assembly as recited in claim 12, wherein the first and second key surfaces are cavities at different distances from the motherboard.

19. The electronic assembly as recited in claim 12, wherein the first and second key surfaces are posts at different distances from the motherboard.

20. The electronic assembly as recited in claim 12, wherein the first key surface is a cavity and the second key surface is a post.

21. A method for assembling an electronic assembly, comprising:

a) mating a substrate of an electronic cartridge with a connector that is mounted to a motherboard by keying a first surface on the cartridge with a first surface on the connector and a second surface on the cartridge with a second surface on the connector, the first and second surfaces on the connector being at a different distances from the motherboard; and, b) fastening said electronic cartridge to a retention mechanism that is mounted to said motherboard with a fastener.

22. The method as recited in claim 21, wherein the fastening is performed by a fastener captured by the electronic cartridge.

23. The method as recited in claim 21, wherein the fastening of the electronic cartridge is performed by a fastener that includes a threaded portion.

* * * * *